(12) United States Patent
Keil

(10) Patent No.: US 10,031,199 B2
(45) Date of Patent: Jul. 24, 2018

(54) IMPLEMENTATION OF A MAGNETIC RESONANCE EXAMINATION AT SEVERAL BED POSITIONS IN THE SCANNER

(71) Applicant: Siemens Aktiengesellschaft, Munich (DE)

(72) Inventor: Miriam Keil, Erlangen-Dechsendorf (DE)

(73) Assignee: Siemens Aktiengesellschaft, Munich (DE)

( * ) Notice: Subject to any disclaimer, the term of this patent is extended or adjusted under 35 U.S.C. 154(b) by 644 days.

(21) Appl. No.: 14/689,308

(22) Filed: Apr. 17, 2015

(65) Prior Publication Data

US 2015/0301137 A1 Oct. 22, 2015

(30) Foreign Application Priority Data

Apr. 17, 2014 (DE) .................. 10 2014 207 435

(51) Int. Cl.
*G01R 33/563* (2006.01)
*G01R 33/30* (2006.01)
(Continued)

(52) U.S. Cl.
CPC ....... *G01R 33/4833* (2013.01); *G01R 33/543* (2013.01); *G01R 33/56383* (2013.01)

(58) Field of Classification Search
CPC ..... A61B 5/055–5/0555; A61B 5/0035; A61B 2090/374; A61B 2090/3954–2090/3958; G01R 33/20–33/4833; G01R 33/56383
(Continued)

(56) References Cited

U.S. PATENT DOCUMENTS

2003/0080738 A1 5/2003 Brinker et al.
2003/0098688 A1 5/2003 Brinker et al.
(Continued)

FOREIGN PATENT DOCUMENTS

JP  H08257024 A  10/1996
JP  2008302096 A  12/2008

OTHER PUBLICATIONS

Heusch et al. (Hybrid [18F]-FDG PET/MRI including non-Gaussian diffusion-weighted imaging (DWI): Preliminary results in non-small cell lung cancer (NSCLC); May 2013; European Journal of Radiology; vol. 82; p. 2055-2060).*

Primary Examiner — Melissa Koval
Assistant Examiner — Rahul Maini
(74) Attorney, Agent, or Firm — Schiff Hardin LLP

(57) ABSTRACT

In a method and magnetic resonance (MR) apparatus for implementing an MR examination of an examination subject with a predetermined MR measurement protocol at several different bed positions of the bed of the MR apparatus, a respective anatomical structure of the examination subject is determined for each of the several bed positions and a respective specific absorption rate is determined for each of the several bed positions as a function of the respective anatomical structure of the examination subject at the corresponding bed position and the predetermined MR measurement protocol. The specific absorption rates for the several bed positions are determined before electromagnetic fields are generated according to the respective predetermined MR measurement protocol. The specific absorption rates are compared with an absorption rate threshold value and a notification is output if at least one of the specific absorption rates exceeds the absorption rate threshold value.

9 Claims, 4 Drawing Sheets

(51) Int. Cl.
*G01R 33/483* (2006.01)
*G01R 33/54* (2006.01)
(58) Field of Classification Search
USPC .................................................. 324/300–322
See application file for complete search history.

(56) References Cited

U.S. PATENT DOCUMENTS

| | | |
|---|---|---|
| 2004/0081341 A1 | 4/2004 | Cherek et al. |
| 2005/0264288 A1 | 12/2005 | Campagna et al. |
| 2006/0047198 A1 | 3/2006 | Sugimoto |
| 2006/0197528 A1 | 9/2006 | Bielmeier et al. |
| 2015/0362567 A1 | 12/2015 | Martin et al. |
| 2016/0128606 A1* | 5/2016 | Sakuragi ............. G01R 33/546 600/415 |

* cited by examiner

IMPLEMENTATION OF A MAGNETIC RESONANCE EXAMINATION AT SEVERAL BED POSITIONS IN THE SCANNER

BACKGROUND OF THE INVENTION

Field of the Invention

The present invention concerns a method for implementing a magnetic resonance examination of an examination subject in a magnetic resonance system with a predetermined magnetic resonance measurement protocol at several different bed positions of an examination bed of the magnetic resonance system. The present invention relates in particular to magnetic resonance whole-body examinations, such as for screening purposes, which are implemented with different magnetic resonance contrasts or magnetic resonance measurement protocols.

Description of the Prior Art

Magnetic resonance examinations can be used in the diagnosis of a multitude of illnesses. Furthermore, magnetic resonance examinations can be used as whole-body examinations for screening purposes, in order to search for sick persons in a defined section of the population within the field of preventative medicine, or to implement various subsequent examinations depending on the illness. A particular advantage of the magnetic resonance examination, in conjunction with screening purposes, is that the examination subject is not exposed to radioactive radiation during the examination. Nonetheless, the examination subject is exposed to electromagnetic fields during a magnetic resonance examination, and it is possible for these fields to be absorbed by biological tissue. The absorption of electromagnetic field energy may result in heating of the tissue and is therefore to be restricted during the implementation of a magnetic resonance examination. The specific absorption rate SAR is used as a measure of the absorption of electromagnetic field energy in biological tissue.

Whole-body examinations, as are used for screening purposes in conjunction with magnetic resonance examinations, may include magnetic resonance examinations with different magnetic resonance contrasts or according to different magnetic resonance measurement protocols. For instance, magnetic resonance measurement protocols can be used according to Turbo Inversion Recovery Magnitude (TIRM), Volume Interpolated Breath-Hold Examination (VIBE) or Diffusion Weighted Imaging (DWI), which are implemented at different bed positions and are then combined with one another.

FIGS. 1 and 2 show schematic representations of examination procedures of an examination of the thorax, abdomen and pelvis at different bed positions with different magnetic resonance measurement protocols. Each box in FIGS. 1 and 2 represents a corresponding magnetic resonance examination with the selected magnetic resonance measurement protocol at the selected bed position. The procedure of the whole-body measurement includes the measurement of different protocols and the repetition of these measurements at different bed positions. In this way, two different strategies can be used, which are shown schematically in FIGS. 1 and 2.

In the strategy shown in FIG. 1, which is also referred to as contrast-based strategy, each individual magnetic resonance measurement protocol or each individual magnetic resonance contrast is measured in sequence at all bed positions. The bed moves, for example, with N contrasts and M bed positions N×M times. The magnetic resonance measurement protocols of a contrast are executed directly one after the other. In FIG. 1, the bed is therefore moved at time instants t1, t2, t3, t4, t5, t6, t7, t8 and t9 respectively to the corresponding bed position and the corresponding measurement is implemented there, i.e. after t1, t2 and t3 respectively a DWI measurement, after t4, t5 and t6 respectively a TIRM measurement and after t7, t8 and t9 respectively a VIBE measurement.

Alternatively to the contrast-based strategy in FIG. 1, a region-based strategy can be implemented, which is shown schematically in FIG. 2. In each position, all contrasts or magnetic resonance protocols are measured in sequence and the bed is then moved to the next position, upon which all contrasts are measured again. The bed therefore only moves M times, namely at time instants t1, t4 and t7.

Despite the increased number of bed movements, the contrast-based strategy in FIG. 1 is generally preferred, since different protocols or sequences can use different fields of view, particularly in the z-direction, and the acquisition time can as a result be minimized such that the different protocols use different bed positions. This is symbolized by the different size of boxes in FIGS. 1 and 2. Furthermore, in the case of the contrast-based strategy, there is a lower probability that an examination subject moves between magnetic resonance examinations at the different bed positions, as a result of which errors in a combined overall tomography can be prevented. The region-based strategy in FIG. 2 requires the same bed positions for all contrasts, which is a necessary requirement particularly when magnetic resonance and positron emission tomography applications are combined.

Regardless of whether the contrast-based strategy or the region-based strategy is used, the aim is to obtain a combined image for the several bed positions for each contrast, for instance a combined image of the thorax, abdomen and pelvis. A requirement for this is that the magnetic resonance images recorded at the different bed positions can be combined suitably, that all measurements of a contrast use the same contrast-determining measurement parameters, such as for instance the same repetition times (TR), the same echo times (TE), the same tilt angles, etc. In order to ensure that the permissible specific absorption rates (SAR) are not exceeded, an SAR monitor is usually provided, which, prior to the start of a magnetic resonance examination at a specific bed position with a determined magnetic resonance measurement protocol, determines the SAR load of the examination subject to be expected. In the examples in FIGS. 1 and 2, the SAR monitor, at times instants t1, t2, t3, t4, t5, t6, t7, t8 and t9, determines the SAR load of the examination subject to be expected for the subsequent magnetic resonance examination respectively. Since the different body regions may have different SAR properties, this may result in the SAR monitor requiring an adjustment of the protocol parameters at individual bed positions, for instance a change in the repetition time TR, the tilt angle or the number of slices. This can result in the combined image indicating different contrasts, which may be shown as stripes in the image or can no longer be combined on account of reduced slices, since the body of the examination subject is no longer measured in detail.

SUMMARY OF THE INVENTION

An object of the present invention is to improve a magnetic resonance examination of an examination subject with a predetermined magnetic resonance protocol at several different bed positions.

According to the present invention, a method is provided for implementing a magnetic resonance examination of an examination subject in a magnetic resonance scanner. The magnetic resonance examination is to take place using a predetermined magnetic resonance measurement protocol, which defines a contrast, for example, and a slice thickness of images of the magnetic resonance examination. The magnetic resonance examination takes place at several different bed positions of the examination bed of the magnetic resonance scanner. The scanner has a known imaging volume in which magnetic resonance data can be reliably required. This imaging volume may be defined, for example, as the volume in which the basic magnetic field has a sufficiently high homogeneity so as to enable the acquisition of magnetic resonance data of the quality that is needed for the image in question. For localizer or scalp images, for examples, a lower quality may be acceptable, whereas a higher quality is needed for diagnostic images that are to be studied in order to answer a specific medical question. The movement of the bed, with the examination subject (patient) thereon, through the scanner causes different anatomical regions of the patient to be successively situated in this imaging volume of the scanner.

In the method according to the invention, the respective anatomical structure of the examination subject that is situated in the imaging volume of the scanner is automatically determined for each of the several bed positions. On the basis of the respective anatomical structure of the examination subject at the different bed positions and the predetermined magnetic resonance measurement protocol, a respective specific absorption rate is automatically determined for each of the several bed positions. The specific absorption rate specifies the absorption of electromagnetic fields in the biological tissue of the examination subject on account of the predetermined magnetic resonance measurement protocol at the corresponding bed position. The specific absorption rates for the several bed positions are determined before the electromagnetic fields are generated according to the predetermined magnetic resonance measurement protocol. Furthermore, prior to generating the electromagnetic fields, the thus determined specific absorption rates are compared with an absorption rate threshold value and a notification is output if at least one of the specific absorption rates exceeds the absorption rate threshold value. The absorption rate threshold value can be determined as a function of the pre-examination, in which the anatomical structure of the examination subject was determined. By the anatomical structure of the examination subject being determined in advance for each of the several bed positions, the specific absorption rate can already be determined in advance for all planned bed positions by taking the planned magnetic resonance measurement protocol into account and if necessary a notification is emitted if permissible specific absorption rates can be exceeded during the magnetic resonance examination. As a result, it is possible to prevent the measurement parameters of the magnetic resonance measurement protocol from having to be changed during the implementation of the magnetic resonance examination at one or more of the bed positions in order to prevent the permissible specific absorption rates from being exceeded. It can thus be ensured that the magnetic resonance images acquired at the different bed positions can be combined with one another such that the combined magnetic resonance image has a uniform contrast and a uniform slice thickness.

In an embodiment, the emission of the notification includes an outputting of a requirement to change at least one parameter of the magnetic resonance measurement protocol, which influences the specific absorption rate, before the electromagnetic fields are generated according to the magnetic resonance measurement protocol. This ensures that the magnetic resonance examination is implemented at all bed positions with the same parameters of the selected magnetic resonance measurement protocol, without the permissible specific absorption rate being exceeded at one of the bed positions. Alternatively or in addition, the at least one parameter can also be adjusted according to defined criteria. This can be implemented for instance automatically without any user interaction, wherein the user can optionally be informed thereof or this is not communicated to the user.

Since it was determined in the manner described above that the specific absorption rates will probably not exceed the permissible limit values during the implementation of the magnetic resonance measurement protocol, the several bed positions can be automatically advanced and electromagnetic fields can be automatically generated according to the magnetic resonance measurement protocol at each of the several bed positions. The resulting magnetic resonance recordings can then be combined with one another, wherein, on account of the uniform contrast in the magnetic resonance recordings at the various bed positions, a combined magnetic resonance recording can be generated, which has a uniform contrast across the entire examined region of the examination subject.

In a further embodiment, the magnetic resonance examination includes an examination of the examination subject with a further predetermined magnetic resonance protocol at several different bed positions. To this end, a respective further specific absorption rate is determined for each of the several bed positions as a function of the respective anatomical structure of the examination subject at the corresponding bed position and as a function of the further predetermined magnetic resonance measurement protocol. The further specific absorption rate defines the absorption of electromagnetic fields in biological tissue of the examination subject as a result of the further predetermined magnetic resonance measurement protocol at the corresponding bed position. The further specific absorption rates are determined, before the electromagnetic fields are generated according to the further predetermined magnetic resonance measurement protocol. The specific absorption rates and the further specific absorption rates are compared with an absorption rate threshold value and a notification is output, if at least one of the specific absorption rates or one of the further specific absorption rates exceeds the absorption rate threshold value. In whole-body examinations, in particular for screening purposes, it may be necessary for various magnetic resonance examinations to be implemented with different magnetic resonance contrasts or different magnetic resonance measurement protocols. In order to ensure that an SAR value does not exceed a permissible limit value in any of the examinations, the specific absorption rates for each bed position and for each magnetic resonance measurement protocol are determined prior to the start of the magnetic resonance examination and the thus determined SAR values for each bed position are compared with an absorption rate threshold value. For instance, the total of all specific absorption rates for the various magnetic resonance measurement protocols can be formed for each bed position and can be compared with a corresponding absorption rate threshold value, which depends on the anatomical conditions of the examination subject for instance. Alternatively or in addition an SAR value can be determined individually for each magnetic resonance measurement protocol at the different bed positions. In addition, a "temporal averaging" SAR exposition can take place during a determined time of for instance six minutes. If the expected specific absorption rate at a bed position exceeds the permissible absorption rate threshold value, a corresponding notification is emitted, whereupon an operating subject of the magnetic resonance system can change the parameters of one or more magnetic resonance measurement protocols in order to prevent specific absorption rates from being exceeded. If it is ensured in this manner that the specific absorption rate is probably not exceeded at any bed position, the magnetic resonance examinations can be implemented with the various magnetic resonance measurement protocols at the various bed positions. The magnetic resonance recordings, which were created with a respective one of the magnetic resonance measurement protocols at the different bed positions, can then be compiled or combined to form a whole-body image, wherein, on account of the magnetic resonance measurement protocol used as standard, it is ensured that the combined recording does not have stripes or other flaws due to different parameters of the individual recordings and exceedance of the permissible SAR value can then be promptly avoided by adjusting the protocols.

In another embodiment, the determination of the anatomical structure of the examination subject includes a further magnetic resonance examination, in which the examination bed is moved continuously through the several bed positions. Magnetic resonance examinations of this type may include for instance a so-called Fast View Localizer examination, which is usually used to determine the position of the patient with respect to the magnetic resonance system or for organ localization purposes. The anatomical structure of the examination subject can thus be easily determined without additional outlay within the scope of the magnetic resonance examination, wherein the localizer examination can be implemented in particular at the start of the examination. Alternatively, a localizer examination of this type can also be implemented in a stationary manner at the several different bed positions.

The magnetic resonance measurement protocol may include for instance a Turbo Inversion Recovery Magnitude (TIRM) magnetic resonance imaging sequence, a Volume Interpolated Breath-Hold Examination (VIBE) magnetic resonance imaging sequence or a Diffusion Weighted Imaging (DWI) magnetic resonance imaging sequence. These magnetic resonance imaging sequences can deliver informative magnetic resonance recordings, in combination with one another, for whole or part-body examinations particularly during screening examinations.

The present invention also encompasses a magnetic resonance apparatus, which includes a basic field magnet, a gradient field system, a radio-frequency antenna and a control computer. The control computer actuates the gradient field system and the radio-frequency antenna, to receive measurement signals recorded by the radio-frequency antenna, to evaluate the measurement signals and to create magnetic resonance tomography images. The magnetic resonance system further includes a moveable examination bed for implementing a magnetic resonance examination of an examination subject with a predetermined magnetic resonance measurement protocol. The magnetic resonance examination is implemented with the predetermined magnetic resonance measurement protocol at several different bed positions. The magnetic resonance system is able to automatically determine a respective anatomical structure of the examination subject for each of the several bed positions and to determine a respective specific absorption rate for each of the several bed positions. The respective specific absorption rate is determined as a function of the respective anatomical structure of the examination subject at the corresponding bed position and the magnetic resonance measurement protocol predetermined for the bed position. The specific absorption rate defines the absorption of electromagnetic fields in biological tissue of the examination subject on account of the predetermined magnetic resonance measurement protocol at the corresponding bed position. The specific absorption rates, which are determined for the several bed positions, are determined before the electromagnetic fields are generated according to the predetermined magnetic resonance measurement protocol. The specific absorption rates are compared with an absorption rate threshold value and a notification is output if at least one of the specific absorption rates exceeds the absorption rate threshold value. The magnetic resonance system is therefore designed to implementing the previously described method and its embodiments and therefore also achieves the advantages described above in conjunction with the method.

Furthermore a non-transitory, computer-readable data storage medium is provided according to the present invention, which can be loaded into a memory of a programmable control computer of a magnetic resonance system. The storage medium is encoded with programming instructions (code) that cause the control computer to implement any or all of the described embodiments of the inventive method, when the code runs in the programmable control computer. The programming instructions may require program means, e.g. libraries or auxiliary functions, in order to realize the corresponding embodiments of the method. The programming instructions may be a source code, e.g. C++, which still has to be compiled and translated and bound, or which only has to be interpreted, or may be an executable software code, which, for execution purposes, only still has to be loaded into the corresponding control facility.

The electronically readable data storage medium may be a DVD, magnetic tape or a USB stick, upon which electronically readable control information is stored.

DESCRIPTION OF THE PREFERRED EMBODIMENTS

Figure 3:
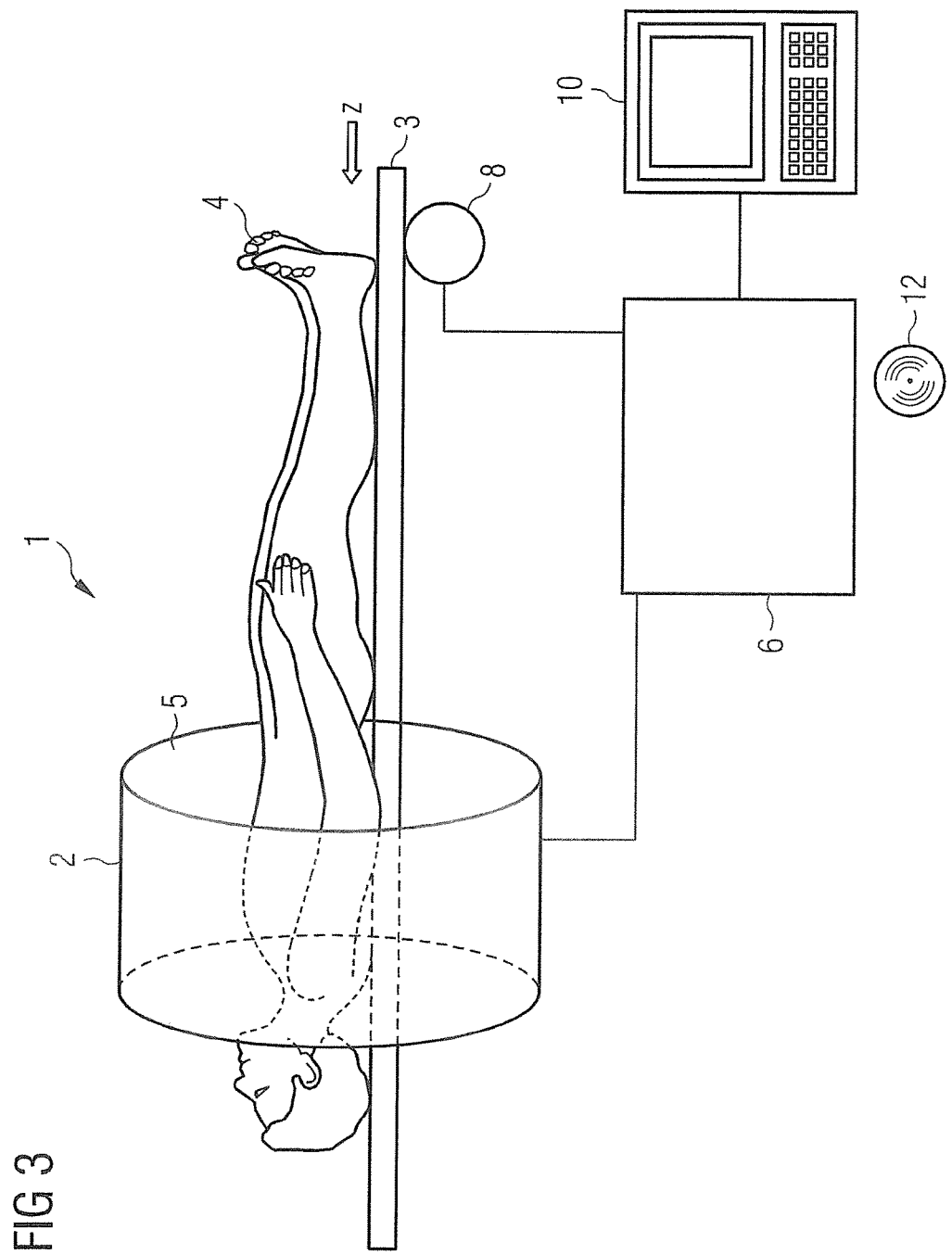
FIG. 3 schematically illustrates a magnetic resonance apparatus according to an embodiment of the present invention.

FIG. 3 is a schematic illustration of a magnetic resonance apparatus 1. The magnetic resonance system 1 includes a scanner (data acquisition unit) 2, an examination bed 3 for an examination subject 4, which can be moved on the examination bed 3 through an opening 5 of the scanner 2, a control computer 6, an evaluation apparatus 7 and a drive unit 8. The control computer 6 actuates the scanner 2 and receives signals from the scanner 2, which are recorded by the scanner 2. In order to generate the magnetic resonance data, the scanner 2 has a basic field magnet (not separately shown), which generates a basic magnetic field $B_0$, and a gradient field system (not separately shown), for generating gradient fields. Furthermore, the scanner 2 includes one or more radio-frequency antennas for generating radio-frequency signals and for receiving measurement signals, which are used by the control computer 6 and the evaluation apparatus 7 for generating magnetic resonance images. The control computer 6 also controls the drive unit 8, in order to move the examination bed 3 along a direction Z together with the examination subject 4 through the opening 5 of the scanner 2. The control computer 6 and the evaluation apparatus 7 may include for instance a processor with a display screen, a keyboard and a data carrier 12, on which electronically readable control information is stored, which is configured such that when the data carrier 12 is used in the evaluation apparatus 7 and the control computer 6, it implements the method 40 described below with reference to FIG. 4.

Figure 1:
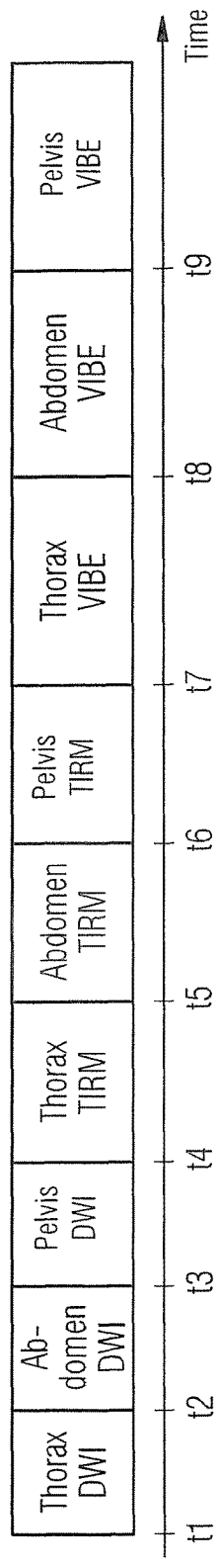
FIG. 1 illustrates a contrast-based strategy for implementing a magnetic resonance examination at several bed positions with several different magnetic resonance measurement protocols.
Figure 2:
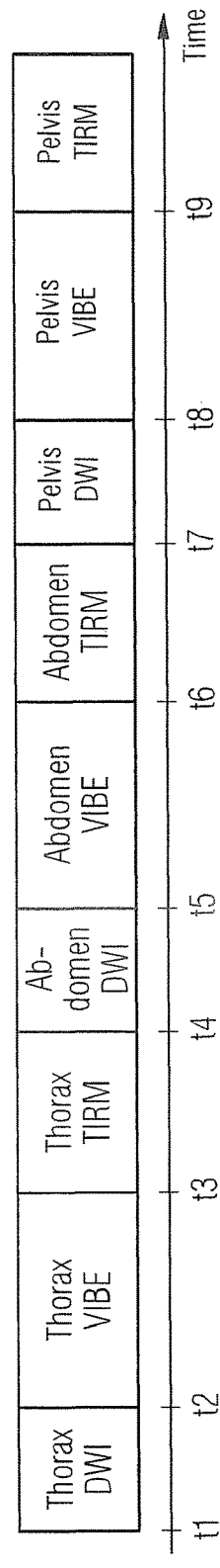
FIG. 2 illustrates a region-based strategy for implementing a magnetic resonance examination at various bed positions with various magnetic resonance measurement protocols.
Figure 4:
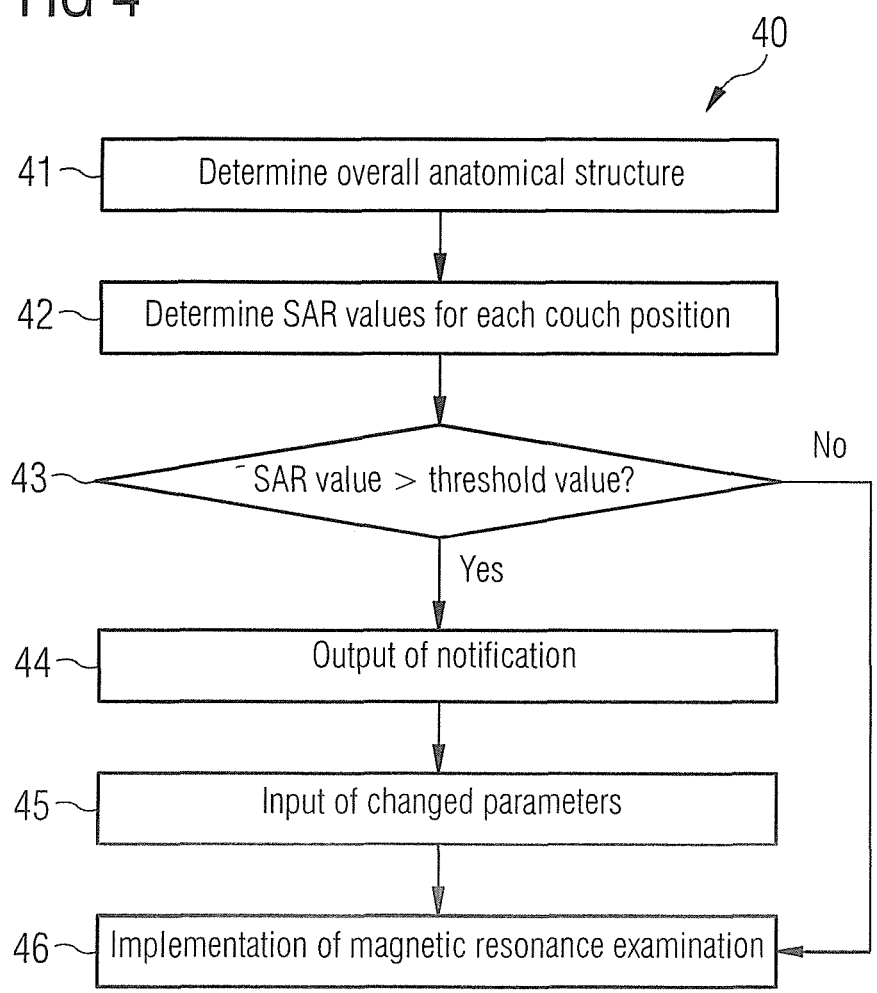
FIG. 4 illustrates a method for implementing a magnetic resonance examination according to an embodiment of the present invention.

Partial or whole-body examinations with a magnetic resonance system are common particularly in screening examinations. Here different magnetic resonance measurement protocols, e.g. T2-TIRM, T1-VIBE and DWI, can be implemented sequentially at different bed positions and then combined. In order to ensure that exposure of the examination subject to electromagnetic fields stays below permissible limits, the specific absorption rate load (SAR load) to be expected of the examination subject is determined at the start of each measurement at each bed position, as was described previously with respect to FIGS. 1 and 2. Since the different body regions have different SAR properties, this may result in the SAR monitor, during the examination at an individual bed position and/or in the case of a specific magnetic resonance protocol, requiring an adjustment of protocol parameters. To avoid this, in the method 40, which is shown in FIG. 4, an anatomical overall structure of the examination subject is firstly determined in step 41. This can be derived for instance by adjusting a Fast View Localizer or another magnetic resonance examination in order to position the patient or for organ localization purposes, in order to calculate a first estimation of the SAR load of the patient to be expected at the different bed positions (step 42). In step 43, the thus determined SAR values are compared with a permissible threshold value. Therefore, a bed position can be determined with a highest SAR load for instance, a so-called worst-case bed position. If in step 43 none of the SAR values exceeds the threshold value, the magnetic resonance examination can be implemented as planned in step 46. Nevertheless, if one or more of the SAR values exceeds the permissible threshold value, a notification is output to a user of the magnetic resonance system 1 in step 44, with which the user is requested to implement a change in protocol, by for instance a changed parameter being input in step 45 for the corresponding magnetic resonance measurement protocol. On the basis of the changed parameters, the SAR values can be determined again for each bed position in step 42, and the magnetic resonance examination, in step 46, can be implemented provided the SAR values remain below the permissible threshold value. Alternatively, the magnetic resonance examination in step 46 can also be implemented directly after inputting changed parameters, or in step 45 only those parameters can be entered which result in the resulting SAR values remaining below the threshold value. The changed parameters are used equally in the magnetic resonance examination for all bed positions, so that, with a combination of the magnetic resonance recordings of the different bed positions, a uniform overall recording, in particular an overall recording with a uniform contrast and a uniform slice thickness, can be created.

In other words, by execution of the method 40, the SAR load is predicted for at least one magnetic resonance measurement protocol for the several different bed positions or even for all magnetic resonance measurement protocols at the several different bed positions. This prediction uses the anatomical structure determined previously. Thus the SAR load is determined both for the current bed position and the protocol associated therewith and also for the worst-case position and the protocol associated there even before the start of the first magnetic resonance examination. The poorer value then enters into the SAR prediction and if necessary activates an input possibility, for instance in the form of a so-called pop-up in order to enable a corresponding change in protocol. This is then applied to all bed positions of the respective magnetic resonance measurement protocol or passed on thereto. The SAR prediction is in this way an additional measure which provides a first estimation of the SAR value to be expected for all bed positions. An SAR estimation can be recalculated as before with the magnetic resonance measurement protocol provided, prior to each magnetic resonance examination at one of the several different bed positions, in order to reliably prevent the exceedance of permissible limit values.

Figure 5:
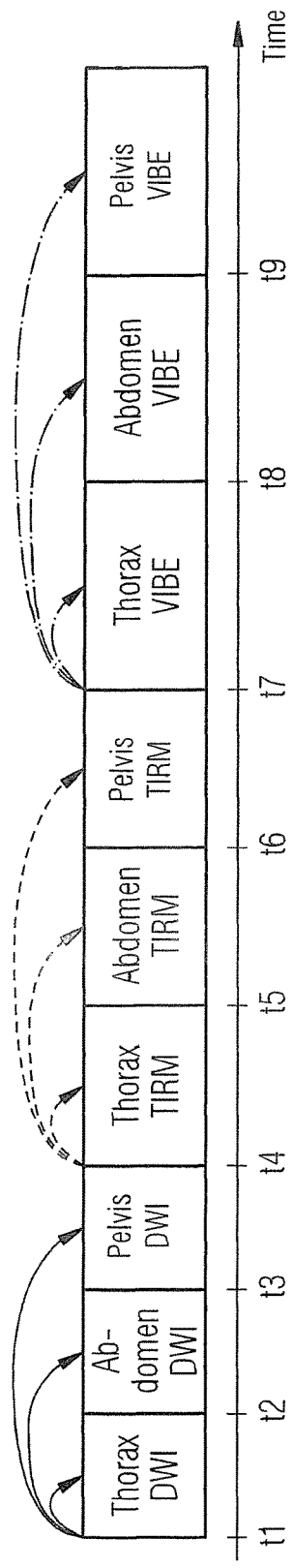
FIG. 5 illustrates a contrast-based strategy for implementing a magnetic resonance examination according to an embodiment of the present invention.

The method described above with respect to FIG. 4 can be used both with the contrast-based strategy described at the start and also with the region-based strategy described at the start. FIG. 5 shows the method in FIG. 4 in conjunction with a contrast-based strategy, in order to implement a magnetic resonance examination at three bed positions (thorax, abdomen and pelvis) with three different magnetic resonance measurement protocols respectively (DWI, TIRM and VIBE).

At time t1, the SAR values for the thorax bed position, the abdomen bed position and the pelvis bed position are determined for the measurement protocol DWI, before the magnetic resonance examination is implemented, as is shown by the continuous arrows. On the basis of the thus determined SAR values, by comparing the SAR values with for instance a predetermined threshold value, it is possible to determine whether the permissible SAR load is expected to be exceeded. If this is the case, a parameter of the DWI magnetic resonance measurement protocol can be adjusted accordingly for all three bed positions. Then the magnetic resonance examination can be implemented with the DWI magnetic resonance measurement protocol.

At time t4, corresponding expected SAR values are in turn determined for the three bed positions of thorax, abdomen and pelvis during the use of the TIRM magnetic resonance measurement protocols and are compared for instance with a corresponding threshold value in order if necessary to adjust parameters of the TIRM magnetic resonance protocols in order to avoid permissible SAR values from being exceeded. The dashed arrows in FIG. 5 indicate that at time instant t4 for the three coach positions of thorax, abdomen and pelvis, the corresponding expected SAR values are determined in each instance. The magnetic resonance examination is then implemented using the TIRM magnetic resonance measurement protocol.

At time t7, corresponding SAR values are determined for the three bed positions of thorax, abdomen and pelvis respectively, which will probably occur with the use of the VIBE magnetic resonance measurement protocol. When it is probable that the permissible SAR value will be exceeded at one of the bed positions, a corresponding SAR pop-up is output in order to provide the user of the magnetic resonance system with the possibility of implementing a change in parameters of the VIBE magnetic resonance measurement protocol. The dotted arrows in FIG. 5 indicate that the SAR values for the three bed positions are determined at time instant t7 prior to implementing the magnetic resonance examination with the aid of the VIBE magnetic resonance measurement protocol.

Figure 6:
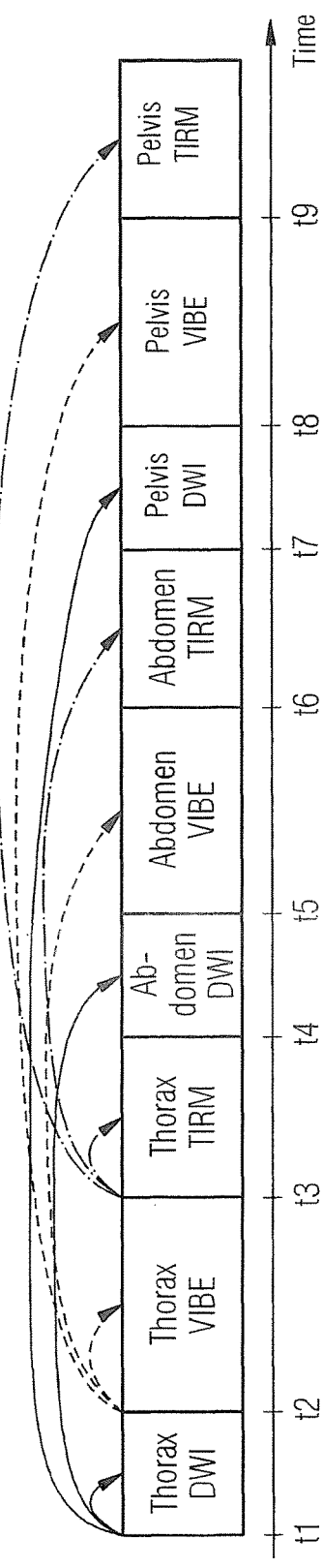
FIG. 6 illustrates a region-based strategy for implementing a magnetic resonance examination according to an embodiment of the present invention.

FIG. 6 is a schematic illustration of the implementation of the method in FIG. 4 in conjunction with a region-based strategy for implementing a magnetic resonance examination at several different bed positions (thorax, abdomen and pelvis) with in each instance several different magnetic resonance measurement protocols (DWI, VIBE and TIRM). Since in step 41 the anatomical overall structure of the examination subject was determined, an SAR value is determined at time t1 for the three coach positions of thorax, abdomen and pelvis respectively, which probably influences the examination subject by using the DWI magnetic resonance measurement protocol (shown by the continuous arrows in FIG. 6). The highest SAR value activates, if necessary, an SAR pop-up, with which a user of the magnetic resonance system is required to change a protocol parameter of the DWI magnetic resonance measurement protocol, in order to reduce the SAR load of the examination subject. Then the magnetic resonance examination can be implemented with the DWI magnetic resonance measurement protocol at the thorax bed position. At time instant t2, as indicated by the dashed arrows, a corresponding SAR value is determined for the bed positions of thorax, abdomen and pelvis in each instance, which will probably occur when the VIBE magnetic resonance measurement protocol is used. If necessary, an SAR pop-up is in turn output in order to change the parameters of the VIBE magnetic resonance measurement protocol and then the magnetic resonance examination is implemented at the thorax bed position by using the VIBE magnetic resonance measurement protocol. At time t3, a corresponding SAR value is determined in each instance for the three bed positions of thorax, abdomen and pelvis, which will probably occur with the magnetic resonance examination using the TIRM magnetic resonance measurement protocol, as shown by the dotted arrows in FIG. 6. In order to prevent an impermissibly high SAR load of the examination subject, if necessary in turn an SAR pop-up is output to a user of the magnetic resonance system in order to modify a protocol parameter of the TIRM magnetic resonance measurement protocol, which influences the SAR load. The magnetic resonance examination is then implemented at the thorax bed position using the TIRM magnetic resonance measurement protocol. Magnetic resonance examinations with the DWI, the VIBE and the TIRM magnetic resonance measurement protocol are then implemented during the further procedure, as shown in FIG. 6, at the abdomen bed position. Finally, from time t7, magnetic resonance examinations are implemented consecutively at the pelvis bed position using the magnetic resonance measurement protocols DWI, VIBE and TIRM.

The previous SAR estimation and if necessary a corresponding SAR adjustment enable different contrasts to be avoided, since in particular necessary changes in protocol can already be implemented prior to the first measurement of a contrast. Similarly, an "incomplete measurement" can be avoided on account of a reduced number of slices. In addition, operation is facilitated since changes in protocol are only implemented once at the start of the magnetic resonance examination with a magnetic resonance measurement protocol. Problems when combining magnetic resonance recordings at the different bed positions can be prevented. This relates in particular to problems due to different contrasts, as a result of which magnetic resonance recordings can in some instances no longer be automatically combined, since the algorithms generally expect the same contrast. Gaps in the measurement cover can similarly be avoided. Furthermore, an improved estimation of the SAR overall load to be expected is also produced. In the method shown in FIGS. 1 and 2, it may occur, for instance, that an examination has a high SAR load of this type for the examination subject, such that the examination has to be prematurely interrupted. It is possible, by the previously described SAR prediction, to predict this already prior to the start of the examination and to adjust the magnetic resonance measurement protocols accordingly so that the entire SAR load remains smaller and the examination can thus be implemented in full. The conventional SAR monitoring, which exists at each bed position during an implementation of a magnetic resonance examination with a magnetic resonance measurement protocol, can be used as before in order to ensure the safety of the examination subject.

Although modifications and changes may be suggested by those skilled in the art, it is the intention of the inventor to embody within the patent warranted hereon all changes and modifications as reasonably and properly come within the scope of her contribution to the art.

I claim as my invention:

1. A method for operating a magnetic resonance (MR) apparatus having an imaging volume and having a patient bed that is movable through said imaging volume, said method comprising:

providing a computer with a protocol input that designates an MR data acquisition protocol to be executed by said MR apparatus, controlled by the computer, in order to acquire MR data from a patient on the patient bed, wherein said MR data acquisition protocol comprises a plurality of individual different protocols that are to be executed in a sequence defined by the MR data acquisition protocol in order to cause each different individual protocol to be respectively executed while a predetermined anatomical portion of the patient is situated, by controlled movement of the patient bed, in the imaging volume, with each combination of a respective individual protocol, and the anatomical portion situated in the imaging volume while that respective individual protocol is executed, having a specific absorption rate (SAR) associated therewith, with said SAR differing for respective different combinations of individual protocols and anatomical portions;

prior to operating said MR apparatus with said computer to execute said MR data acquisition protocol, providing said computer with a further input that designates an overall anatomy of the patient;

also prior to operating said MR apparatus with said computer to execute said MR data acquisition protocol, executing a prediction algorithm in said computer wherein a predicted SAR is predicted for each combination in said MR data acquisition protocol;

also prior to operating said MR apparatus with said computer to execute said MR data acquisition protocol, comparing, in said computer, each predicted SAR with a predetermined SAR limit, and emitting a notification output from said computer if any predicted SAR does not comply with said predetermined SAR limit;

if said notification output is emitted, then receiving a change input into said computer that changes said MR data acquisition protocol, and repeating execution of said prediction algorithm, said comparing, said emission of said notification output, and said changing of said MR data acquisition protocol, until no notification output is emitted, and thereby obtaining an SAR-compliant MR data acquisition protocol that still comprises said plurality of individual, different protocols; and emitting control signals corresponding to said SAR-compliant MR data acquisition protocol to said MR apparatus so as to operate said MR apparatus, without interruption due to SAR non-compliance, in order to obtain said MR data from the patient with all of said combinations in said MR data acquisition protocol.

2. The method as claimed in claim 1 comprising emitting said notification output as a request to change at least one parameter that influences said SAR in said MR data acquisition protocol.

3. The method as claimed in claim 1 comprising providing said computer with said MR data acquisition protocol wherein said plurality of different individual protocols are selected from the group consisting of a Turbo Inversion Recovery Magnitude MR imaging sequence, a Volume Interpolated Breath-Hold Examination magnetic resonance imaging sequence, and a Diffusion Weighted Imaging magnetic resonance imaging sequence.

4. A magnetic resonance (MR) apparatus comprising:

an MR data acquisition scanner having an imaging volume and having a patient bed that is movable through said imaging volume;

a computer provided with a protocol input that designates an MR data acquisition protocol to be executed by said MR apparatus, controlled by the computer, in order to acquire MR data from a patient on the patient bed, wherein said MR data acquisition protocol comprises a plurality of individual compliant protocols that are to be executed in a sequence defined by the MR data acquisition protocol in order to cause each different individual protocol to be respectively executed while a predetermined anatomical portion of the patient is situated, by controlled movement of the patient bed, in the imaging volume, with each combination of a respective individual protocol, and the anatomical portion situated in the imaging volume while that respective individual protocol is executed, having a specific absorption rate (SAR) associated therewith, with said SAR differing for respective different combinations of individual protocol and anatomical portions;

prior to operating said MR apparatus with said computer to execute said MR data acquisition protocol, said computer also being provided with a further input that designates an overall anatomy of the patient;

said computer being configured to execute, prior to operating said MR apparatus with said computer to execute said MR data acquisition protocol, a prediction algorithm wherein a predicted SAR is predicted for each combination in said MR data acquisition protocol;

said computer being configured to compare, also prior to operating said MR apparatus with said computer to execute said MR data acquisition protocol, each predicted SAR with a predetermined SAR limit, and to emit a notification output from said computer if any predicted SAR does not comply with said predetermined SAR limit;

if said notification output is emitted, said computer being configured to receive a change input into said computer that changes said MR data acquisition protocol, and to repeat execution of said prediction algorithm, said comparison, said emission of said notification output, and said changing of said MR data acquisition protocol, until no notification output is emitted, and thereby obtain an SAR-compliant MR data acquisition protocol that still comprises said plurality of individual, different protocols; and said computer being configured to emit control signals corresponding to said SAR-compliant MR data acquisition protocol to said MR apparatus so as to operate said MR apparatus, without interruption due to SAR non-compliance, in order to obtain said MR data from the patient with all of said combinations in said MR data acquisition protocol.

5. The MR apparatus as claimed in claim 4: wherein said computer is configured to emit said notification output as a request to change at least one parameter, that influences said SAR, in said MR data acquisition protocol.

6. The MR apparatus as claimed in claim 4: wherein said individual different protocols in said MR data acquisition protocol are selected from the group consisting of a Turbo Inversion Recovery Magnitude MR Imaging Sequence, a Volume Interpolated Breath-Hold Examination Magnetic Resonance Imaging Sequence, and a Diffusion Weighted Imaging Magnetic Resonance Imaging Sequence.

7. A non-transitory, computer-readable data storage medium encoded with programming instructions, said storage medium being loaded into a computer of a magnetic resonance (MR) apparatus having an imaging volume and having patient bed that is movable through said imaging volume, said programming instructions causing said computer to:

receive a protocol input that designates an MR data acquisition protocol to be executed by said MR apparatus, controlled by the computer, in order to acquire MR data from a patient on the patient bed, wherein said MR data acquisition protocol comprises a plurality of individual compliant protocols that are to be executed in a sequence defined by the MR data acquisition protocol in order to cause each different individual protocol to be respectively executed while a predetermined anatomical portion of the patient is situated, by controlled movement of the patient bed, in the imaging volume, with each combination of a respective individual protocol, and the anatomical portion situated in the imaging volume while that respective individual protocol is executed, having a specific absorption rate (SAR) associated therewith, with said SAR differing for respective different combinations of individual protocol and anatomical portions;

prior to operating said MR apparatus with said computer to execute said MR data acquisition protocol, receive a further input that designates an overall anatomy of the patient;

also prior to operating said MR apparatus with said computer to execute said MR data acquisition protocol, execute a prediction algorithm wherein a predicted SAR is predicted for each combination in said MR data acquisition protocol;

also prior to operating said MR apparatus with said computer to execute said MR data acquisition protocol, compare each predicted SAR with a predetermined SAR limit, and emit a notification output from said computer if any predicted SAR does not comply with said predetermined SAR limit;

if said notification output is emitted, then receive a change input into said computer that changes said MR data acquisition protocol, and repeating execution of said prediction algorithm, said comparison, said emission of said notification output, and said change of said MR data acquisition protocol, until no notification output is emitted, and thereby obtain an SAR-compliant MR data acquisition protocol that still comprises said plurality of individual, different protocols; and emit control signals corresponding to said SAR-compliant MR data acquisition protocol to said MR apparatus so as to operate said MR apparatus, without interruption due to SAR non-compliance, so as to obtain said MR data from the patient with all of said combinations in said MR data acquisition protocol.

8. The data storage medium as claimed in claim 7 wherein said programming instructions caused said computer to emit said notification output as a request to change at least one parameter, that influences said SAR, in said MR data acquisition protocol.

9. The data storage medium as claimed in claim 7 wherein: wherein said individual different protocols in said MR data acquisition protocol are selected from the group consisting of a Turbo Inversion Recovery Magnitude MR Imaging Sequence, a Volume Interpolated Breath-Cold Examination Magnetic Resonance Imaging Sequence, and a Diffusion Weighted Imaging Magnetic Resonance Imaging Sequence.

* * * * *